(12) United States Patent
Danyuk et al.

(10) Patent No.: US 11,502,654 B2
(45) Date of Patent: Nov. 15, 2022

(54) SINGLE-ENDED DIFFERENTIAL TRANSIMPEDANCE AMPLIFIER

(71) Applicant: Harman International Industries, Incorporated, Stamford, CT (US)

(72) Inventors: Dimitri Danyuk, Stamford, CT (US); Todd A. Eichenbaum, Oxford, CT (US)

(73) Assignee: Harman International Industries, Incorporated, Stamford, CT (US)

( * ) Notice: Subject to any disclaimer, the term of this patent is extended or adjusted under 35 U.S.C. 154(b) by 63 days.

(21) Appl. No.: 17/061,078

(22) Filed: Oct. 1, 2020

(65) Prior Publication Data

US 2022/0109413 A1 Apr. 7, 2022

(51) Int. Cl.
*H03F 3/45* (2006.01)

(52) U.S. Cl.
CPC ..... *H03F 3/4508* (2013.01); *H03F 2200/129* (2013.01); *H03F 2203/45116* (2013.01); *H03F 2203/45526* (2013.01)

(58) Field of Classification Search
CPC ............ H03F 3/4508; H03F 2200/129; H03F 2203/45116; H03F 2203/45526
USPC ................................................ 330/252–261
See application file for complete search history.

(56) References Cited

U.S. PATENT DOCUMENTS

| | | |
|---|---|---|
| 3,434,069 A | 3/1969 | Jones |
| 3,868,583 A | 2/1975 | Krabbe |
| 4,055,812 A | 10/1977 | Rosenthal |
| 4,232,271 A | 11/1980 | Dobkin et al. |
| 4,577,160 A | 3/1986 | Lettvin et al. |
| 4,628,279 A | 12/1986 | Nelson |
| 5,075,633 A | 12/1991 | Bowers |
| 5,258,723 A | 11/1993 | Mazzucco et al. |

(Continued)

FOREIGN PATENT DOCUMENTS

| | | |
|---|---|---|
| EP | 3582395 A1 | 12/2019 |
| JP | 2013005373 A | 1/2013 |

OTHER PUBLICATIONS

Bowers D. F., "Instrumentation Amplifiers", Wiley Encyclopedia of Electrical and Electronics Engineering, John Wiley and Sons, 1999, 12 pgs.

(Continued)

*Primary Examiner* — Samuel S Outten
*Assistant Examiner* — Khiem D Nguyen
(74) *Attorney, Agent, or Firm* — Brooks Kushman P.C.

(57) ABSTRACT

In at least one embodiment, a differential amplifier including first and second current transfer systems, a current difference producing system, and a feedback network circuit is provided. The first current transfer system generates a first differential current signal. The second current transfer system generates a second differential current signal. The current difference producing system receives the first differential current signal and the second differential current signal and generates a voltage difference signal that is indicative of a difference between a first current signal and a second current signal. The feedback network circuit converts the voltage difference signal into at least two converted current signals and provides the at least two converted current signals to one of the first and second current transfer systems or the current difference producing system to minimize the difference between the first current signal and the second current signal.

16 Claims, 9 Drawing Sheets

(56) References Cited

U.S. PATENT DOCUMENTS

| | | | |
|---|---|---|---|
| 6,492,871 | B2 | 12/2002 | Liu et al. |
| 7,268,624 | B2 | 9/2007 | Chen et al. |
| 7,439,803 | B1 | 10/2008 | Dasgupta |
| 2007/0290757 | A1 | 12/2007 | Gilbert et al. |

OTHER PUBLICATIONS

Brokaw A. P. et al., "An improved monolithic instrumentation amplifier," IEEE J. Solid-State Circuits, Dec. 1975, pp. 417-423, vol. SC-10, No. 6.
Hawksford M.O.J., "Current-Steering Transimpedance Amplifiers for High-Resolution Digital-to-Analogue Converters," AES 109th Convention, Sep. 2000, 27 pgs.
Jung W., "High performance audio stages using transimpedance amplifiers," The Audio Amateur, 1992, 4 pgs.
Kitchin C. et al., "A designer's guide to instrumentation amplifiers," Analog Devices, 2006, 130 pgs.
Özoğuz S. et al., "A new versatile building block: Current Differencing Buffered Amplifier and its applications," European Conference on Circuit Theory and Design (ECCTD'99), Jan. 1999, 5 pgs.
Plassche R. J. v. d., "A wide-band monolithic instrumentation amplifier," IEEE J. Solid-State Circuits, Dec. 1975, pp. 424-431, vol. SC-10, No. 6.
Smedegaard M., "Low Input Impedance Current-to-Voltage Conversion Circuit for Current-Output Digital-to-Analog Converters," AES 101st Convention, Nov. 1996, 29 pgs.
Zand B. et al., "Transimpedance amplifier with Differential Photodiode Current Sensing," Proceedings of the IEEE, 1999, 4 pgs.
Extended European Search Report for Application No. 21200446.9 filed Oct. 1, 2021, dated Mar. 3, 2022, 10 pgs.

SINGLE-ENDED DIFFERENTIAL TRANSIMPEDANCE AMPLIFIER

TECHNICAL FIELD

Aspects disclosed herein generally provide for, but not limited to, analog circuits and to a differential transimpedance amplifier. In one aspect, the differential transimpedance amplifier may be implemented in an audio system or a method for providing an audio system. This aspect and others will be discussed in more detail herein.

BACKGROUND

U.S. Pat. No. 7,268,624 to Chen et al. ("Chen") discloses offset voltages in differential amplifiers that are minimized by controlling compensation currents through the load impedances of the amplifiers. The currents are varied while sensing the polarity of the offset voltage. When the polarity changes, the current values are latched to keep the offset voltage at a minimum.

SUMMARY

In at least one embodiment, a differential amplifier including a first input terminal, a second input terminal, a first current transfer system, a second current transfer system, a current difference producing system, and a feedback network circuit is provided. The first current transfer system generates a first differential current signal in response to the first current signal. The second current transfer system generates a second differential current signal in response to the second current signal. The current difference producing system receives the first differential current signal and the second differential current signal and generates a voltage difference signal that is indicative of a difference between first current signal and the second current signal. The feedback network circuit converts the voltage difference signal into at least two converted current signals and provides the at least two converted current signals to one of the first and second current transfer systems or the current difference producing system to minimize the difference between the first current signal and the second current signal based on the at least two converted current signals.

In at least another embodiment, a differential amplifier including a first current transfer system, a second current transfer system, a current difference producing system, and a feedback network circuit is provided. The first current transfer system generates a first differential current signal in response to the first current signal. The second current transfer system generates a second differential current signal in response to the second current signal. The current difference producing system receives the first differential current signal and the second differential current signal and generates a voltage difference signal that is indicative of a difference between first current signal and the second current signal. The feedback network circuit converts the voltage difference signal into at least two converted current signals and provides the at least two converted current signals to one of the first and second current transfer systems or the current difference producing system to minimize the difference between the first current signal and the second current signal based on the at least two converted current signals.

In at least another embodiment, a method for minimizing current between a first current and a second current is provided. The method includes providing a first current signal and a second current signal and generating a first differential current signal via a first current transfer system in response to the first current signal. The method further includes generating a second differential current signal via a second current transfer system in response to the second current signal and receiving the first differential current signal and the second differential current signal at a current difference producing system. The method further includes providing a voltage difference signal that is indicative of a difference between first current signal and the second current signal and converting the voltage difference signal into at least two converted current signals. The method further includes providing the at least two converted current signals to one of the first and second current transfer systems or the current difference producing system to minimize the difference between the first current signal and the second current signal based on the at least two converted current signals.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1A:
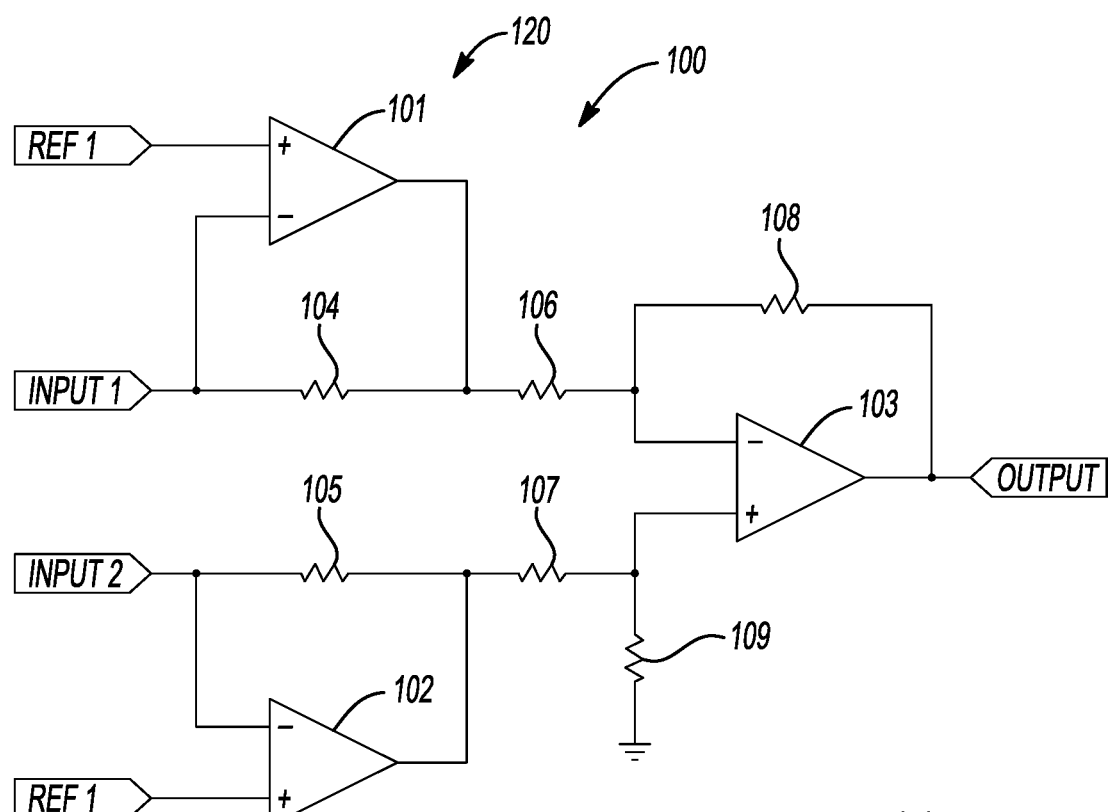
FIG. 1A depicts a first differential voltage feedback transimpedance amplifier.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Aspects disclosed herein provide a transimpedance amplifier that receives a current input and provides a voltage output. The transimpedance amplifier is configured for providing low input impedance in wide frequency range and low distortion. The transimpedance amplifier includes low impedance current transfer input circuits, a current difference producing system (or circuit) and voltage amplifier including a feedback of an active circuit or a passive circuit between output terminals, input terminals, and current difference producing circuit terminals.

Aspects disclosed herein also provide a differential transimpedance amplifier with which differential to single-ended conversion may be achieved without conventional voltage feedback circuits and which provides performance enhancement, particularly in signal chain for high-resolution audio systems. The disclosed differential transimpedance amplifiers may be alternatively employed in fully differential configurations. The disclosed embodiments provide flexible solutions to analog conversion applications without design tradeoffs that are inherent in using conventional transimpedance amplifiers. For example, the disclosed embodiments may reduce the design complexity of a single-ended differential transimpedance amplifier and reduces input impedances of a single-ended differential transimpedance amplifier. The disclosed embodiments may improve linear and non-linear distortion in a single-ended differential transimpedance amplifier and add an extra degree of flexibility in the design of a single-ended differential transimpedance amplifier. For example, the disclosed embodiments may provide (i) stable transimpedance (e.g. transfer function) in a wide frequency range, (ii) low input impedance in wide frequency range, (iii) high rejection of common-mode signal, (iv) low distortion, and (v) low sensitivity to out-of-band interference (e.g., low intermodulation).

For achieving the above improvements, the disclosed embodiments provide a single-ended differential transimpedance amplifier, in which first and second input terminals are connected to first and the second input current transfer systems. The first and/or second input current transfer systems may amplify and track the amplified output if such circuit are generally the same and provide attenuation. The first and second input current transfer systems transmits an input current to a current difference producing circuit. An output current of the current difference producing circuit is converted to voltage on a load network. A voltage amplifying circuit conveys voltage from load network terminals to an output terminal and to a feedback network.

In one implementation, the feedback network aspect as disclosed herein may involve passive feedback network that provides signals to differential transimpedance amplifier inputs. The amplifier inputs are transimpedance since current is provided as an input and voltage is provided as an output, thus voltage divided by the current provides an impedance. In another implementation, the feedback network aspect may involve an active feedback network to differential amplifier inputs by the first and second current steering feedback systems. In another implementation, the feedback network aspect may involve active feedback to the differential amplifier inputs by providing a voltage to current converter (or a transconductance circuit). In another implementation, the feedback network aspect may involve passive or active feedback to the inputs of current difference producing system by any method or circuit of the approach described above.

FIG. 1A depicts a first differential voltage feedback transimpedance amplifier 100. The amplifier 100 includes a first operational amplifier 101, a second operational amplifier 102, and a third operational amplifier 103. An input stage 120 of the amplifier 100 includes the first and second operational amplifiers 101 and 102 that provide a voltage feedback. The first and the second operational amplifiers 101 and 102 operate as virtual-earth current to voltage converters. The first and second operational amplifiers (or first and second current to voltage converters 101 and 102) are suitably connected so that a differential output voltage as provided therefrom is applied to inverting and non-inverting inputs of the third operational amplifier 103 that is connected as a difference amplifier. The first differential transimpedance amplifier 100 as illustrated in FIG. 1A requires three gain blocks and a precise matching of resistors 104, 105, 106, 107, 108, and 109.

Figure 1B:
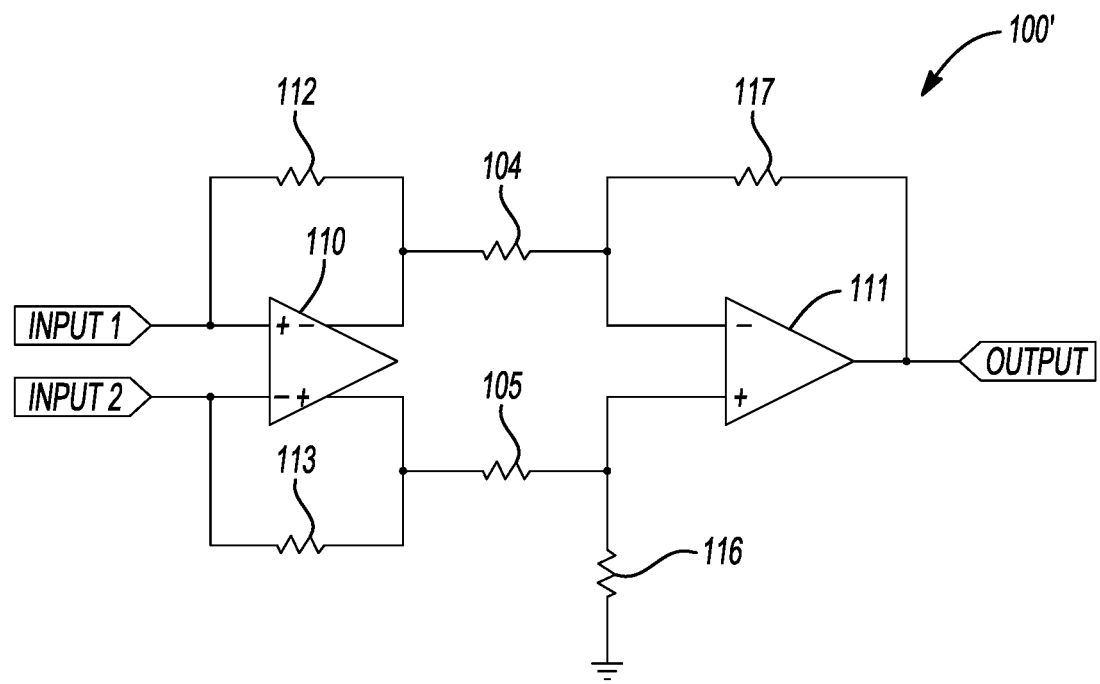
FIG. 1B depicts a second differential voltage feedback transimpedance amplifier.

FIG. 1B depicts a second differential transimpedance amplifier 100' that includes a fully differential operational amplifier 110 and an operational amplifier 111 that are coupled as a difference amplifier. In general, there may be a few error mechanisms in the differential transimpedance amplifiers 100 and 100'. One such error mechanism may be related to the op-amp open-loop gain dependence on frequency. For example, the resulted input impedance and frequency may be inversely proportional to an op amp gain and that may be limited by an op-amp gain-bandwidth-product. Another error mechanism may be induced by out of band fast transients that cause intermodulation distortion and differential-phase distortion produced by non-linearity in the input stage(s). In general, the first differential transimpedance amplifier 100 and the second differential transimpedance amplifier 100' may suppress common mode noise. However, the degree of suppression is limited by the matching component values and the frequency dependent parameters of the differential amplifiers 103 (see FIG. 1A) and 111 (see FIG. 1B).

Figure 2A:
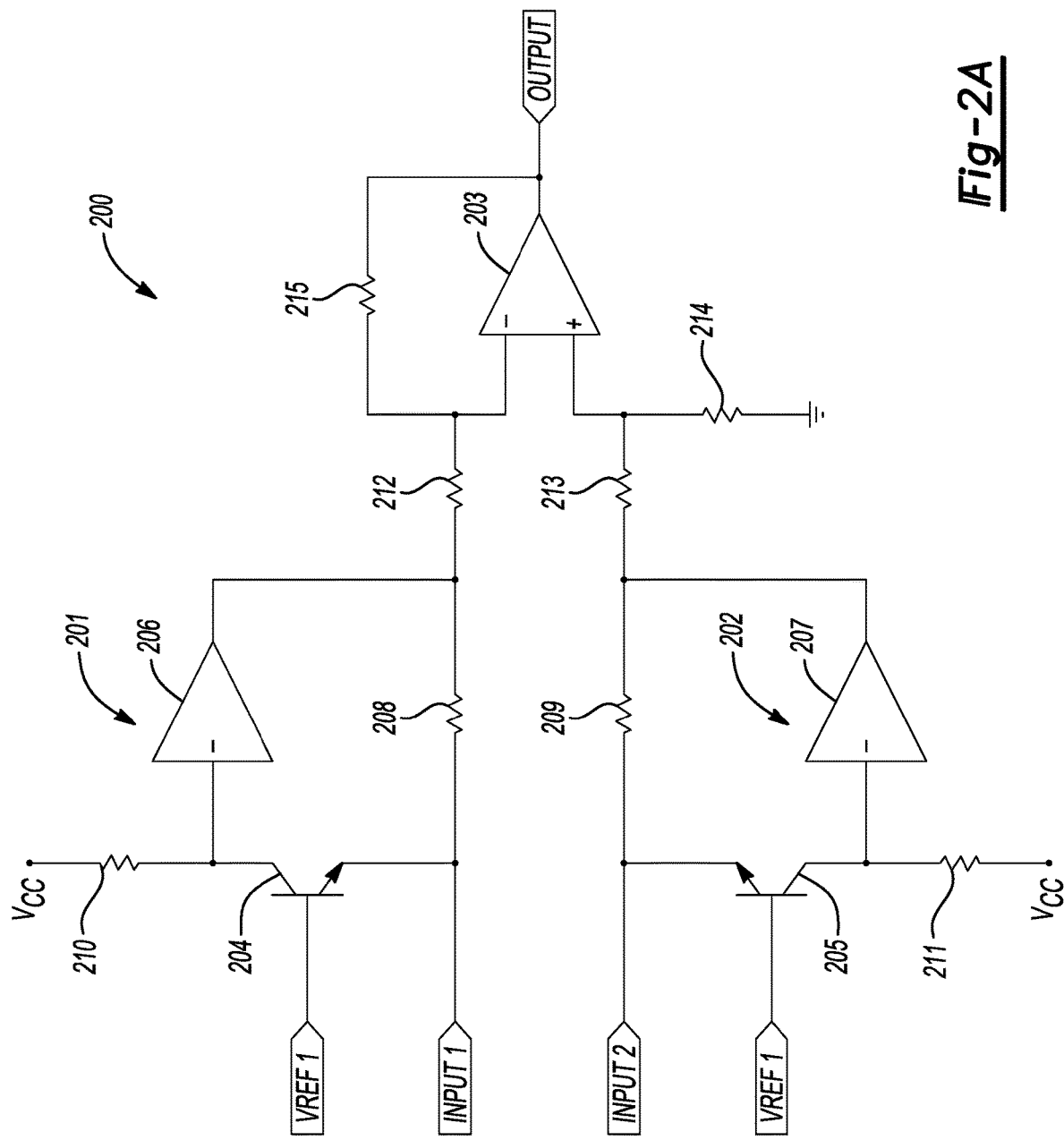
FIG. 2A depicts a first differential current feedback transimpedance amplifier.

FIG. 2A depicts a first differential transimpedance amplifier 200. The amplifier 200 of FIG. 2A is offered to provide a solution to shortcomings to the amplifiers 100 and 100' as disclosed above. For example, the amplifier 200 is a current feedback type operational amplifier and may employ fast acting circuitry. The amplifier 200 includes current feedback type amplifiers 201 and 202 that operate as current to voltage converters and are suitably connected so that a differential input current is applied to inverting low impedance inputs of the amplifiers 201 and 202 while output voltages of the amplifiers 201 and 202 are applied as a differential input to operational amplifier 203, that is connected as a difference amplifier. Each amplifier 201 and 202 includes a low input impedance input stage of transistors 204 and 205 and error amplifiers 206 and 207. Each current feedback type amplifier 201 and 202 responds to an error current at an input terminal thereof, which is the difference between an input signal current and current supplied through feedback resistors 208 and 209. Input stages 204, 205 (or transistors 204, 205) deliver a transient error current into a high impedance compensation node without limiting a current value. This aspect may allow for fast charging and discharging of a frequency compensation network. In general, the input stages 204, 205 may inject a large amount of current from a low impedance network formed by the error amplifier 206, 207 which may provide for a wider frequency response.

Figure 2B:
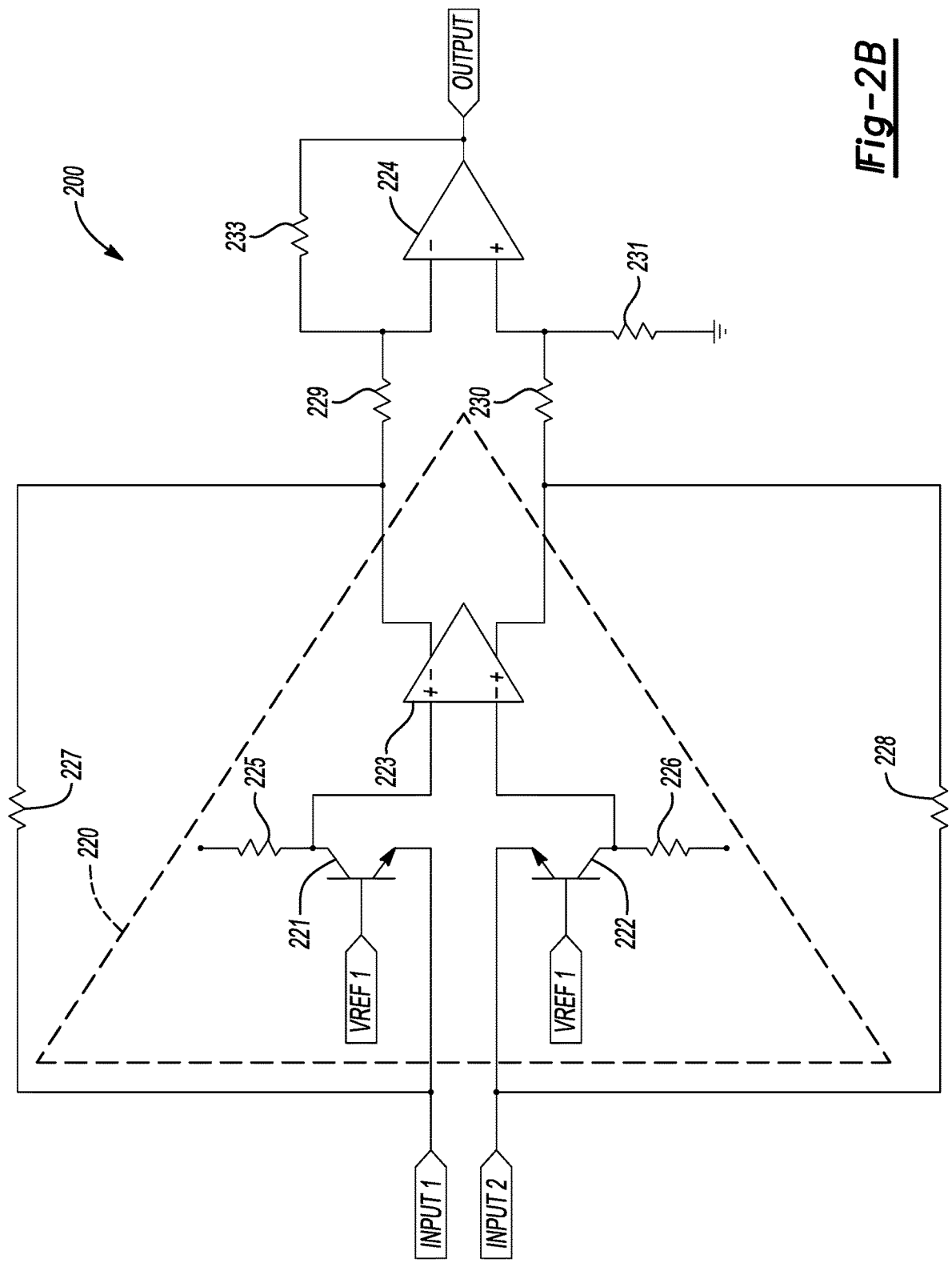
FIG. 2B depicts a second differential current feedback transimpedance amplifier.

FIG. 2B depicts a second differential transimpedance amplifier 200'. The amplifier 200' includes a fully differential transimpedance amplifier 220 and operational amplifier 224 operably connected to one another to form a difference amplifier. Fully differential transimpedance amplifier 220 comprises two low input impedance input stages (or transistors) 221 and 222 and a fully differential error amplifier 223. A load 225 (or an active load such as for example, a resistor, a current source, transistor or a passive load such as for example, a capacitor or an inductor) is operably coupled to the transistor 221. Similarly, load 226 (or an active load such as for example, a resistor, a current source, transistor or a passive load such as for example, a capacitor or an inductor) is operably coupled to the transistor 222. Resistors 229 and 230 are coupled to outputs of the error amplifier 223. Resistor 231 is coupled to a noninverting input of the operational amplifier 224 and resistors 231, 233 form a bridge between an inverting input and an output of the operational amplifier 224. The amplifiers 200 and 200' may lack overall flexibility in a design of a single-ended differential transimpedance amplifier and therefore fails to provide transimpedance and an input impedance independence advantage. It is desirable to obtain (i) a stable transimpedance (e.g., transfer function) in a wide frequency range, (ii) low input impedance in a wide frequency range, (iii) high rejection of common mode signals, (iv) low distortion, and (v) a low sensitivity to out-of-band interference (e.g., low intermodulation).

Figure 3:
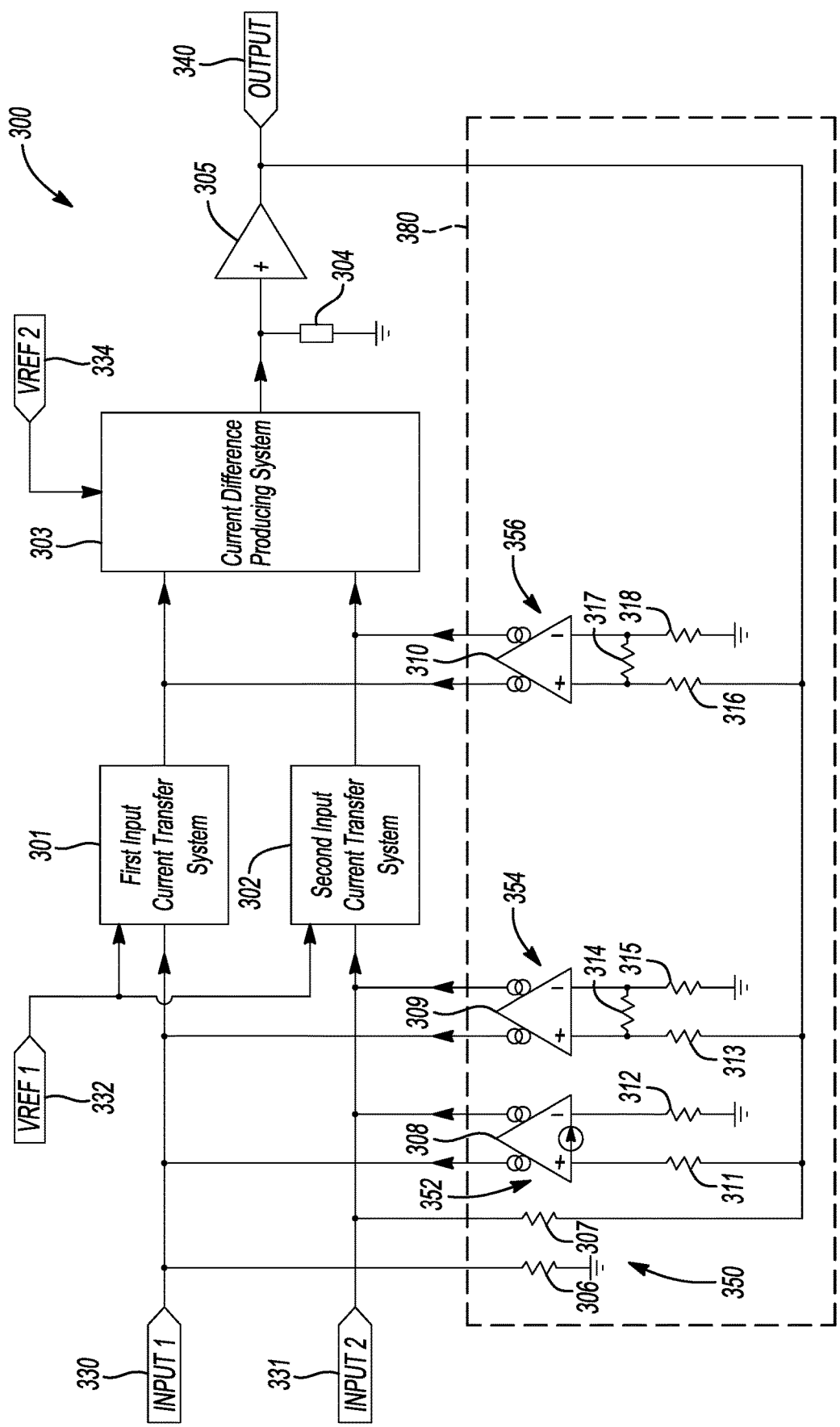
FIG. 3 depicts a block diagram of a differential transimpedance amplifier in accordance with an embodiment.

FIG. 3 depicts a block diagram of an amplifier 300 in accordance with an embodiment. The amplifier 300 includes a first input current transfer system (or circuit) 301 (or first low impedance current transfer system) 301 and a second input current transfer system (or circuit) (or second low input impedance input current transfer system) 302. In general, each of the first and the second input current transfer system 301, 302 is configured to convert current as an input variable also to current as an output variable. Input terminals 330 and 331 are coupled to the first input current transfer system 301 and the second input current transfer system 302, respectively. In general, each of the first input current transfer system 301 and the second input current transfer system 302 may include any number of transistor stages with each system 301 and 302 providing a low input impedance. Additionally, the first and the second input current transfer systems 301 and 302 may each provide a high output impendence.

A current difference producing system 303 receives output signals from the first and the second low impedance input current transfer systems 301 and 302. An output stage 305 (e.g., amplifier or amplifier system) is operably coupled to an output of the current difference producing system 303. In one example, the output stage 305 may be a voltage-controlled voltage source. The output from the output stage 305 is fed back to the first and second input current transform systems 301, 302 via the input terminals 330, 331. The current difference producing system 303 generates a difference signal that is indicative of a difference in current between the first and the second input current transfer systems 301 and 302. For example, the current different producing system 303 converts the difference signal from a current to current which is indicative of the difference in current between the first and the second input current transfer systems 301 and 302. The output current of the current difference producing system 303 is converted to a voltage by a load (or resistor(s)) 304. As noted above, the output stage 305 may be a voltage-controlled voltage source and amplifies the voltage difference signal to generate an amplified voltage difference signal.

A feedback network circuit 380 is positioned downstream of the output stage 305 that receives the amplified voltage difference signal and converts the same into a current difference signal. The feedback network circuit 380 controls the current being provided to the first and the second input current transfer systems 301 and 302 based on the amplified voltage difference signal.

The feedback network circuit 380 generally includes one of a first circuit (or first steering current system) 350, a second circuit (or second steering current system) 352, a third circuit (or first steering current system) 354, and a fourth circuit (or fourth steering current system) 356. The first circuit 350 generally corresponds to a passive current steering feedback system. The second circuit 352 generally corresponds to an active current steering feedback system based on transimpedance. The third circuit 354 and the fourth circuit 356 generally correspond to an active current steering feedback system based on transconductance.

While FIG. 3 generally illustrates that the feedback network circuit 380 incorporates each of the first circuit 350, the second circuit 352, the third circuit 254, and the fourth circuit 356, it is recognized that only one of such circuits 350, 352, 354, 356 will actually be implemented in the amplifier 300 as part of the feedback network circuit 380. The selection of the particular circuit 350, 352, 354, and 356 utilized in the circuit 312 may depend on a number of factors. Such factors may include frequency, sensitivity, and/or a deviation of transfer function from specifications.

Assuming for the sale of example that the feedback network circuit 380 may comprise the first circuit 350, the first circuit 350 includes passive components 306 and 307. While FIG. 3 generally illustrates that the passive components 306 and 307 are in the form of resistive network, it is recognized that the passive components 306 and 307 may comprise capacitors and inductors. The passive components 306 and 307 provide a current feedback signal to the current input provided to the differential transimpedance amplifier 300 as received on the input terminals 330 and 331. In general, the current (or steering current) provided by the passive components 306 and 307 assist in minimizing the current differential (or current difference) between the input currents provided at the inputs 330 and 331 in response to amplified voltage difference signal. The passive components 306 and 307 generate the current in response to the amplified voltage difference signal as output by the output stage 305. To minimize the differential in current to the amplifier 300, the passive component 306 and 307 generate two output currents including the same value but having an opposite polarity to one another. The current that flows through the passive component 306 is summed with the current provided on the first input terminal 330 and the current that flows through the passive component 307 is summed with the current provided on the second input terminal 331. These aspects compensate for the difference in current between the first input terminal 330 and the second input terminal 331

Assuming for the sake of example that the feedback network circuit 380 includes the second circuit 352, the second circuit 352 includes passive components 311 and 312 that are coupled to a non-inverting input and an inverting input of a first transimpedance stage 308, respectively. The first transimpedance stage 308 receives current at the inputs and transfers current at outputs thereof. While the passive components 311 and 312 are generally illustrated as resistors (or resistive network) in FIG. 3, it is recognized that the passive components 311 and 312 may comprise capacitors and inductors. The first transimpedance stage 308 outputs a current which is proportional to current that flows through the passive components 311 and 312. The transimpedance stage 308 may be a current-controlled current source that forms a current feedback network with passive components 311, 312. The second circuit 352 minimizes the current difference between the input currents provided at the inputs 330 and 331 in response to the amplified voltage difference signal as output by the output stage 305.

For example, the first transimpedance stage 308 provides two output currents having the same value but having an opposite polarity to one another. One current value as output by the transimpedance stage 308 is summed with current on the first input terminal 330 and the other current value as output by the first transimpedance stage 308 is summed with current on the second input terminal 331. This aspect may compensate for the difference in current between the first input terminal 330 and the second input terminal 331.

Assuming for the sake of example that the feedback network circuit 380 includes the third circuit 354, the third circuit 354 includes passive components 313, 314, and 315 that are coupled to one another and a first transconductance stage 309. While the passive components 313, 314, and 315 are generally illustrated as resistors (or resistive network) in FIG. 3, it is recognized that the passive components 313, 314, and 315 may comprise capacitors and inductors. Voltage is provided as an input to the passive components 313, 314, and 315 and to the first transconductance stage 309. The first transconductance stage 309 outputs a current which is proportional to a voltage drop across the passive component 314. The third circuit 354 minimizes the current differential between the input currents provided at the inputs 330 and 331 in response to the amplified voltage difference signal as output by the output stage 305.

The first transconductance stage 309 may be a voltage to current converter that forms a voltage feedback network with the passive components 313, 314, and 315. The first transconductance stage 309 provides two output currents having the same value but having an opposite polarity to one another. One current value as output by the first transconductance stage 309 is summed with current on the first input terminal 330 and the other current value as output by the first transconductance stage 309 is summed with current on the second input terminal 331. This aspect may compensate for the difference in current between the first input terminal 330 and the second input terminal 331.

Assuming for the sake of example that the feedback network circuit 380 includes the fourth circuit 356, the fourth circuit 356 includes passive components 316, 317, and 318 that are coupled to another and a second transconductance stage 310. While the passive components 316, 317, and 318 are generally illustrated as resistors (or form a resistive network) in FIG. 3, it is recognized that the passive components 316, 317, and 318 may comprise capacitors and inductors. Voltage is provided as an input to the passive components 316, 317, and 318 and to the second transconductance stage 310. The second transconductance stage 310 outputs a current which is proportional to a voltage drop across the passive component 317. The fourth circuit 356 minimizes the current differential between the input currents as output by the first and the second current transfer systems 301, 302 in response to the amplified voltage difference signal as output by the output stage 305.

The second transconductance stage 310 may be a voltage to current converter that forms a voltage feedback network with the passive components 316, 317, and 318. The second transconductance stage 310 provides two output currents having the same value but having an opposite polarity to one another. One current value as output by the second transconductance stage 310 is summed with a current that is output by the first current transfer system 301 and the other current value as output by the second transconductance stage 310 is summed with a current that is output by the second current transfer system 302. This aspect may compensate for the difference in current between the first input terminal 330 and the second input terminal 331. Alternatively, the second steering current system (or second circuit) 352 may comprise a passive feedback network that is similar to the first circuit 350. A first reference terminal 332 provides a voltage reference (e.g., Vref1) to the first and the second current transfer systems 301, 302. A second reference signal 334 provides a voltage reference (e.g., Vref2) to the current difference producing system 303.

Figure 4:
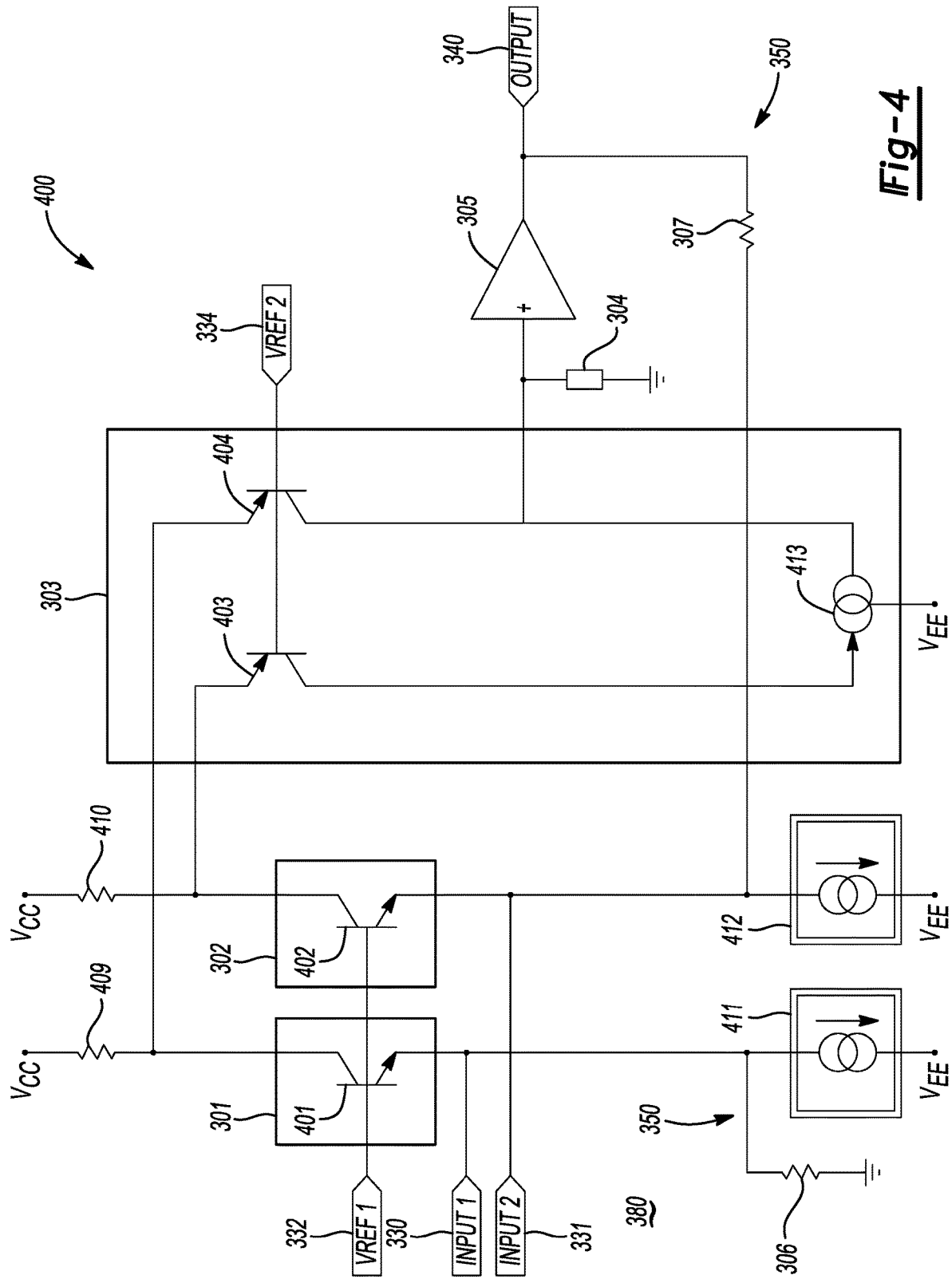
FIG. 4 depicts a schematic diagram of a differential transimpedance amplifier with a passive feedback loop in accordance with an embodiment.

FIG. 4 depicts a schematic diagram of a differential transimpedance amplifier 400 with a passive feedback loop (e.g., the first circuit 350 as set forth in FIG. 3) in accordance with an embodiment. The amplifier 400 includes the first and second input current transform systems 301 and 302, the current difference producing system 303, the load 304, the output stage 305, and the second transimpedance stage 308. The first input current transform system 301 includes a transistor 401 and the second input current transform system 302 includes a transistor 402. In one example, the transistors 401, 402 are bipolar junction devices. The collector of each transistor 401, 402 is connected to a load 409, 410, respectively. The loads 409, 410 may be passive (e.g., resistor, capacitor, or inductor) or active. The load 409 is connected to a collector of the first transistor 401 and a first power source (or Vcc), e.g., a fixed voltage within an audio processing system or any other suitable application. The load 410 is connected to a collector of the second transistor 402 and to the first power source (or Vcc). An emitter of the transistor 401 is connected to the first input terminal 330. An emitter of transistor 402 is connected to the second input terminal 331. The first input terminal 330 and the second input terminal 331 provide an input current to the amplifier 400. Bases of the input transistors 401, 402 are connected to a first reference terminal 332, which provides a reference signal to control operation of the transistors 401, 402. An emitter of each transistor 401, 402 is respectively connected to a constant current source 411, 412. The current sources 411, 412 set the bias current through the low input impedance current transfer input stages (e.g., through the transistors 401, 402).

In operation, the first input transistor 401 and the second transistor 402 forms a common-base that is coupled to the first reference terminal 332 that provides a voltage reference (e.g., Vref1). Transistors 403, 404 of the current difference producing system 303 are level-shifting devices and each emitter of the transistors 403, 404 are connected to a collector terminal of transistors 401, 402. The collector of the transistor 401 is connected to the emitter of the transistor 403. The collector of the second input transistor 402 is connected to an emitter of the second common-base transistor 404. The bases of the transistor 403 and the transistor 404 are connected to a second reference terminal 334 that provides a second voltage reference (e.g., Vref2). The collectors of both the transistors 403, 404 are respectively connected through a current mirror 413 of the current difference producing system 303 to a second power source. In this example, the current mirror 413 acts as a load to the common-base stages. The resistors 409, 410 act as current setting devices that set the current for an amplifying stage (e.g., the transistors 401, 402, 403, 404). As noted above, the current difference producing circuit 303 includes the common base transistors (403, 404), the current mirror 413 and associated circuitry. The load 304 is connected between the single input of the output stage 305 and the common terminal (e. g., a ground). The output stage 305 may include a single input voltage amplifier. The output stage 305 outputs the single ended output signal (or the amplified voltage difference signal).

In an example, the emitter of the transistor 401 is connected to the passive component 306 (or resistor, capacitor, inductor, etc.). In another example, a source of the transistor 402 is connected to an output through the passive component 307 (or resistor, capacitor, inductor, etc.). The passive component 311 which is a part of feedback network circuit 380 provides the feedback current to an inverting input (or the first input terminal) 331 of the transimpedance differential amplifier 400 and defines the overall transimpedance of the amplifier 400. Current sources 411 and 412 are dc current sources and such current sources 411, 412 provide necessary current to the first and second input current transform systems 301 and 302. In general, the current sources 411 and 412 are not the part of the feedback network circuit 380. The current sources 411 and 412 provide power similarly to Vcc, Vee, Vref1, Vref2.

Figure 5:
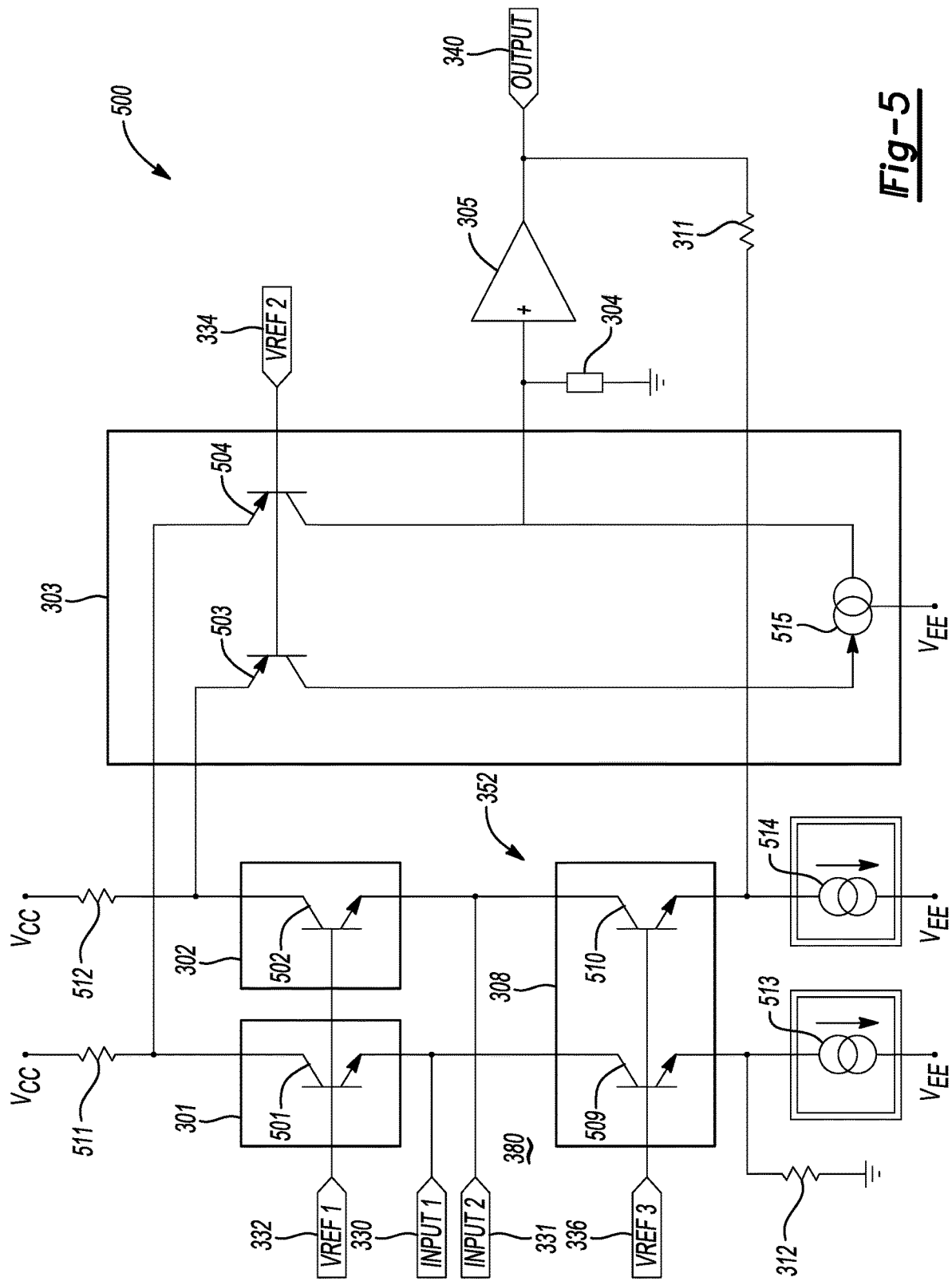
FIG. 5 depicts a schematic diagram of another differential transimpedance amplifier with an active passive feedback loop in accordance with an embodiment.

FIG. 5 depicts a schematic diagram of another differential transimpedance amplifier 500 with an active feedback loop (or the second circuit 352 from FIG. 3) in accordance with an embodiment. The amplifier 500 includes the first and second input current transform systems 301 and 302, the current difference producing system 303, the load 304, and the output stage 305. The first and second input current transform systems 301, 302 includes transistors 501, 502, respectively. The transistors 501, 502 may be implemented as bipolar junction devices. The current difference producing system 303 includes the transistors 503, 504 and a current mirror 515. The first transimpedance stage 308 includes transistors 509, 510.

A collector of each of the transistor 501, 502 is connected to loads 511, 512, respectively. The loads 511, 512 may be passive (e.g., resistor, capacitor, or inductor) or active. The load 511 is connected to the collector of first transistor 501 and a first power source (or Vcc), e.g., a fixed voltage within an audio processing system. The load 512 is connected to the collector of second transistor 502 and the first power source (or Vcc). An emitter of transistor 501 is connected to the first input terminal 330 that provides current into the amplifier 500. The emitter of transistor 502 is connected to the second input terminal 331 that also provides current into the amplifier 500. Bases of input transistors 501, 502 are connected to a first reference terminal 331, which provides a reference signal (e.g., Vref1) to control operation of the transistors 501, 502. The emitter of each transistor 501, 502 is connected to a collector of the transistors 509, 510 respectively.

In operation, the transistors 501, 502 of the first and second input current transform systems 301, 302 each form a common-base stage. The transistors 503, 504 are level shifting and each transistor 503, 504 includes an emitter being connected to a collector terminal of transistors 501, 502. The collector of the transistor 501 is connected to an emitter of the transistor 503. The collector of the transistor 502 is connected to an emitter of the transistor 504. Bases of the transistor 503 and the transistor 504 are connected to the second reference terminal 334 (e.g., Vref2). The collectors of both the transistors 503, 504 are respectively connected through current mirror 515 to a second power source (e.g., Vee). In this example, the current mirror 515 acts as a load to the common-base stages of the transistors 503, 504. The loads 511, 512 act as current setting devices that set the current for the amplifying stage (e.g., the output stage 305). In this example, the current difference producing system 303 includes the transistors 503, 504, the current mirror 515 and associated circuitry. The load 304 is connected between the single input to the output stage 305 and a common terminal (e.g., a ground). The output stage 305 may be a single input voltage amplifier. The output stage 305 outputs the single ended output signal.

In an example, the emitter of the transistor 509 is connected to the passive component 312. In another example, the emitter of the transistor 510 is connected to the output of the amplifier 506 through the passive component 311. The passive component 311, which is a part of a feedback network circuit 380 acts to alter the overall transimpedance of the amplifier 500. The bases of transistors 509, 510 are connected to a third reference terminal 336. The emitter of each transistor 509, 510 is respectively connected to a constant current source 513, 514. The current sources 513, 514 set the bias current through the low impedance the first and second input current transfer systems 301, 302 and the feedback network circuit 380, e.g., through the transistors 501, 502, 509, 510.

Figure 6:
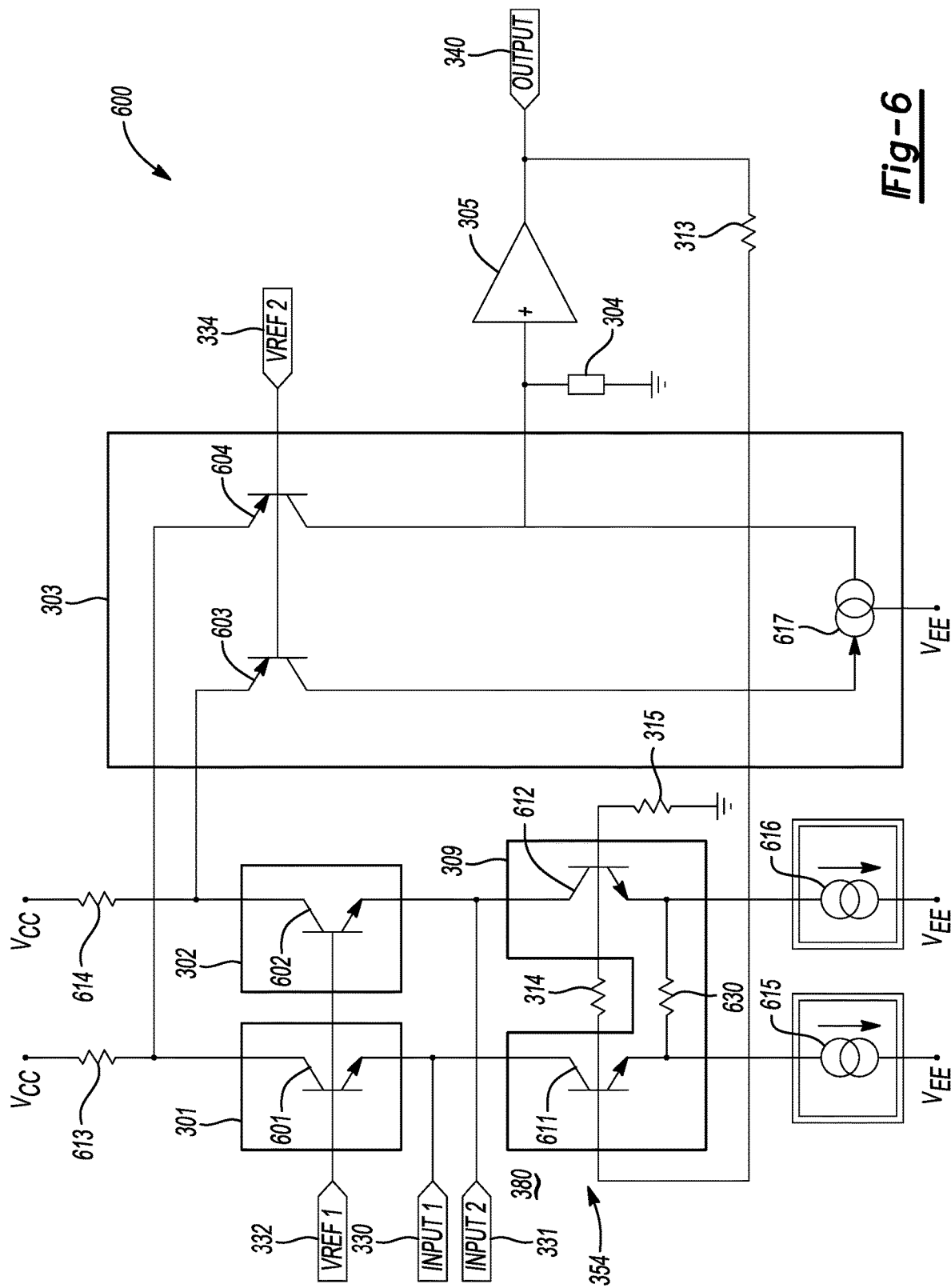
FIG. 6 depicts a schematic diagram of another differential transimpedance amplifier with an active feedback loop in accordance with an embodiment.

FIG. 6 depicts a schematic diagram of another differential transimpedance amplifier 600 with an active feedback loop (or the third circuit 354 from FIG. 3) in accordance with an embodiment. The amplifier 600 includes the first and second input current transform systems 301 and 302, the current difference producing system 303, the load 304, the output stage 305, and the first transconductance stage 309. The first and second input current transform systems 301, 302 includes the transistors 601, 602, respectively. The transistors 601, 602 may be implemented as bipolar junction devices. The current difference producing system 303 includes the transistors 603, 603 and a current mirror 617. The first transconductance stage 309 includes transistors 611, 612 (or voltage controlled current sources) and load 630.

The active feedback loop (or the third circuit 354) may be connected from an output terminal 340 to an input of a common base stage through voltage controlled current sources 611, 612. A collector of each transistor 601, 602 is connected to loads (e.g., resistors, capacitors, or inductors) 613, 614, respectively. The load 613 is connected to the collector of the transistor 601 and the first power source (or Vcc), e.g., a fixed voltage within an audio processing system. The load 614 is connected to the collector of second transistor 602 and the first power source. An emitter of transistor 601 is connected to the first input terminal 330. An emitter of transistor 602 is connected to the second input terminal 331. Bases of the transistors 601, 602 are connected to a first reference terminal 332, which provides a reference signal (e.g., Vref) to control the operation of the transistors 601, 602. The emitter of each transistor 601, 602 is connected to collector of the transistor 611, 612 respectively.

In operation, the transistors 601, 602 of the first and second input current transform systems 301, 302 each include a common-base. The transistors 603, 604 are level shifting and each transistor 603, 604 includes an emitter being connected to a collector terminal of the transistors 601, 602. The collector of the transistor 601 is connected to an emitter of the transistor 603. The collector of the transistor 602 is connected to an emitter of the transistor 604. Bases of the transistor 603 and the transistor 604 are connected to a second reference terminal 334 (e.g., Vref2). The collectors of the transistors 603, 604 are respectively connected through the current mirror 617 to a second power source (e.g. Vee). In this example, the current mirror 617 acts as a load to the common-base stages of the transistors 603, 604. The load 613, 614 act as current setting devices that set the current for the current difference producing system 303. As noted above, the current difference producing circuit 303 includes the transistors 603, 604 and the current mirror 617. The load 304 is connected between the single input to the output stage 305 and the common terminal (e. g., a ground). The output stage 305 may include a single input voltage amplifier. The output stage 305 outputs the single ended output signal.

In one example, emitters of the transistors 611 and 612 are connected through the resistor 610. In another example, a base of the transistor 611 is connected to an output of the amplifier through load 313, the base of transistor 612 is connected to the ground through load 315 and the bases of the transistors 611 and 612 are connected through the load 314. The load 313-315, which are a part of an active feedback network, act to alter the overall transimpedance of the amplifier 600. The emitter of each transistor 611, 612 is respectively connected to a constant current source 615, 616. The current sources 615, 616 set the bias current through the low impedance first and second input current transfer stages 301, 302 and the first transconductance stage 309, e.g., through the transistors 601, 602, 611, 612.

Figure 7:
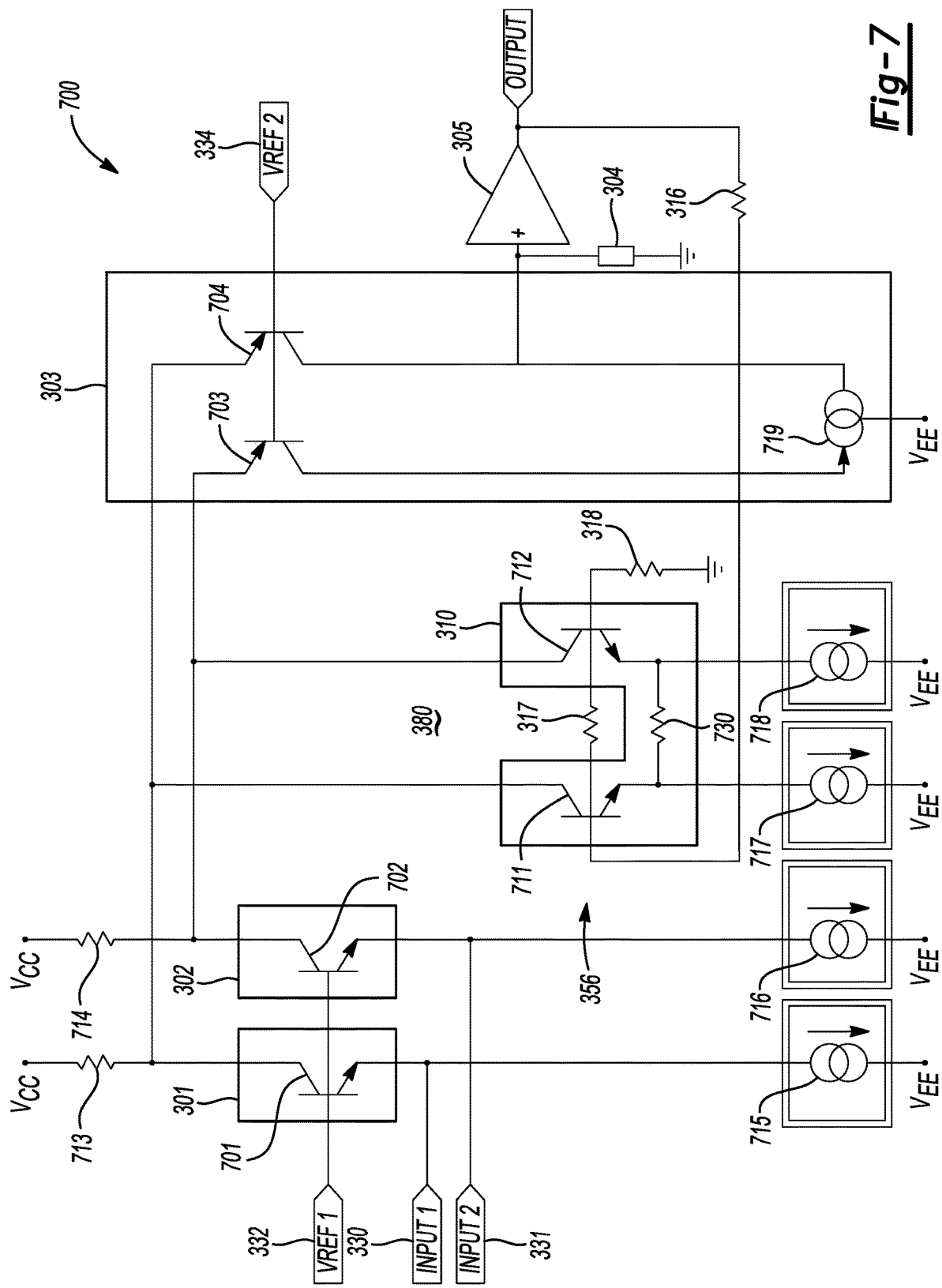
FIG. 7 depicts a schematic diagram of another differential transimpedance amplifier with an active feedback loop in accordance with an embodiment.

FIG. 7 depicts a schematic diagram of another differential transimpedance amplifier 700 with an active feedback loop (or the fourth circuit 356 from FIG. 3) in accordance with an embodiment. The amplifier 700 includes the first and second input current transform systems 301 and 302, the current difference producing system 303, the load 304, the output stage 305, and the second transconductance stage 310. The first and second input current transform systems 301, 302 includes the transistors 601, 602, respectively. The first and second input current transform systems 301, 302 includes the transistors 701, 702, respectively. The transistors 701, 702 may be implemented as bipolar junction devices. The current difference producing system 303 includes the transistors 703, 704 and a current mirror 719. The second transconductance stage 310 includes transistors 711, 712 and a load 730 (e.g., resistor, capacitor, or inductor).

A collector of each transistor 701, 702 is connected to a load (e.g., resistor, capacitor, or inductor) 713, 714, respectively. The load 713 is connected to the collector of transistor 701 and the first power source (or Vcc), e.g., a fixed voltage within an audio processing system. The load 714 is connected to the collector of the transistor 702 and the first power source. An emitter of the transistor 701 is connected to the first input terminal 330. The emitter of transistor 702 is connected to the second input terminal 331. Bases of the transistors 701, 702 are connected to the first reference terminal 332 (e.g., Vref1), which provides a reference signal to control operation of the transistors 701, 702. The emitter of each transistor 701, 702 is respectively connected to a constant current source 715, 716. The current sources 715, 716 set the bias current through the low impedance first and second input current transform systems 301 and 302, e.g., through the transistors 701, 702.

In operation, the transistor 701 and the transistor 702 of the first and second input current transform systems 301, 302 each includes a common-base stage. The transistors 703, 704 are level shifting devices and each transistor 703, 704 includes an emitter being connected to a collector terminal of transistors 701, 702. The collector of the transistor 701 is connected to an emitter of the transistor 703. The collector of the transistor 702 is connected to an emitter of the transistor 704. Bases of the transistor 703 and the transistor 704 are connected to a second reference terminal 334 (e.g., Vref2). The collectors of both the transistors 703, 704 are respectively connected through current mirror 719 to a second power source (e.g., Vee). In this example, the current mirror 719 acts as a load to the common-base stages of the transistors 703, 704. The loads 713, 714 act as current setting devices that set the current for the output stage 305. As noted above, in this example, the current difference producing system 303 includes of the transistors 703, 704; the current mirror 719 and associated circuitry. The current sources 715, 716 set the bias current through the low impedance first and second input current transform systems 301, 302, e.g., through the transistors 701, 702. The load 304 is connected between the single input to the output stage 305 and a common terminal (e.g., a ground). The output stage 305 can include a single input voltage amplifier. The output stage 305 outputs the single ended output signal.

In an example, the collector of each transistor 711, 712 of the third transconductance stage 310 is connected to the inputs of current difference producing circuit 303. The collector of the transistor 711 is connected to the emitter of transistor 704 and the collector of transistor 712 is connected to emitter of transistor 703. In one example, the emitters of the transistors 711 and 712 are connected through the load 730, the base of the transistor 711 is connected to the output of the amplifier through load 316, the base of transistor 712 is connected to the ground through the load 318 and the bases of the transistors 711 and 712 are connected through the load 317. The load 316-318, which are a part of feedback network circuit 380, act to alter the overall transimpedance of the amplifier 700. The emitter of each transistor 711, 712 is respectively connected to the constant current sources 717, 718. The current sources 717, 718 set the bias current through the active feedback stage, e.g., through the transistors 711, 712.

Figure 8:
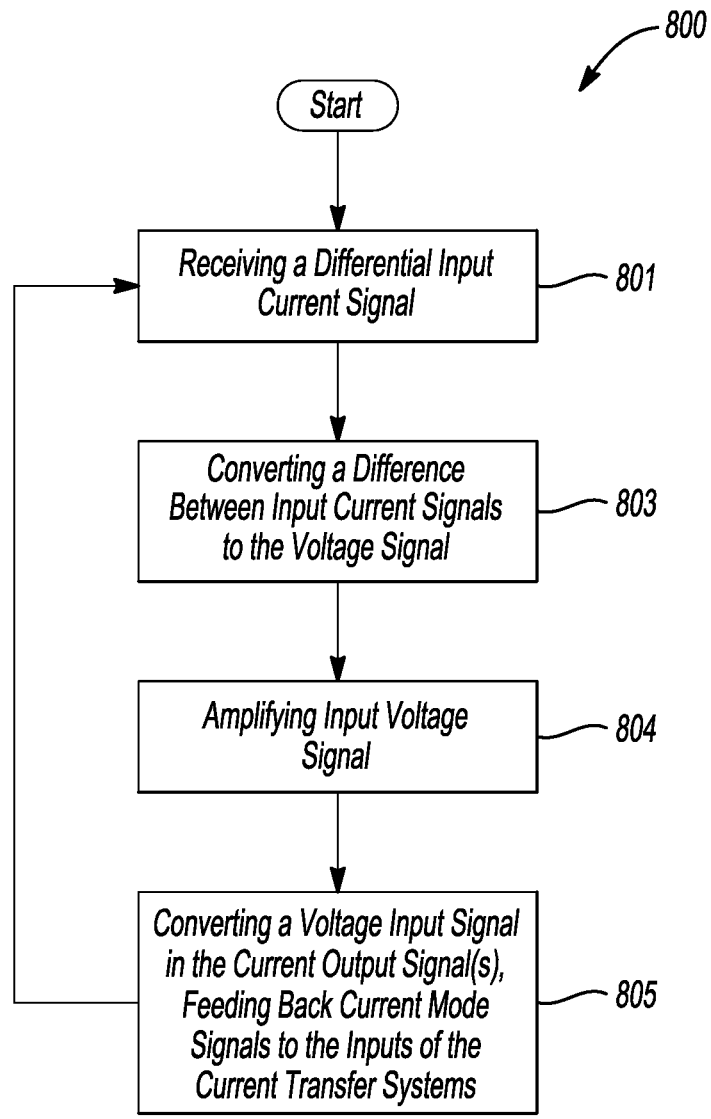
FIG. 8 a method performed by any of the differential transimpedance amplifiers as set forth in FIGS. 3-7 in accordance to one embodiment.

FIG. 8 depicts a method 800 performed by any of the differential transimpedance amplifiers 300 along with the first circuit 350, the second circuit 352, the third circuit 354, and the fourth circuit 356 as set forth in FIG. 3 (and in FIGS. 4-7) in accordance to one embodiment. The apparatus 300 will be referenced in connection with the method 800 for purposes of description. Again, it is recognized that any one of the amplifiers 300, 400, 500, 600 and 700 may employ the method 800.

In operation 801, the first input current transform system 301 receives a first input current signal and the second input current transform system 302 receives a second input current signal. In general, the each of the first input current transfer system 301 and the second input current transfer system 302 may include any number of transistor stages with each system 301 and 302 to transfer the current (e.g., such a transfer may include amplification, attenuation, or tracking) from the input terminals 330, 331 to the output terminal 340. The first input current transform system 301 provides a first input differential current signal in response to the first input current signal. The second input current transform system 302 provides a second input differential current signal in response to the second input current signal.

In operation 803, the current difference producing system 303 obtains currents from the first input differential current signal and the second input differential current signal to generate the difference signal. As noted above, the difference signal is indicative of a difference in current between first and the second input differential current signals. The load 304 converts the current as identified in the difference signal into a voltage output.

In operation 804, the amplifier 305 amplifies the voltage output to generate an increased voltage output. In operation 805, the feedback network circuit 380 (e.g., the first circuit 350, the second circuit 352, and the third circuit 354) converts the increased voltage output into a first converted current signal and a second converted current signal which are separately provided to respective inputs of the first and the second input current transform systems 301, 302 for the circuits 350, 352, and 354. The fourth circuit 356 of the feedback network circuit 380 converts the increased voltage output into a converted current signal which is separately provided to outputs of the first and the second input current transform systems 301, 302 (or inputs of the current difference producing system 303.

For each the circuits 350, 352, and 354, the feedback network circuit 380 provides two output currents (e.g., the first converted current signal and the second converted current signal) having the same value but having an opposite polarity to one another. One current value (e.g., the first converted current signal) as output by the feedback network circuit 380 by any one of the first, second and third circuits 350, 352, and 354 is summed with current on the first input terminal 330 and the other current value (e.g., the second converted current signal) as output by any one of the first, second, and third circuits 350, 352, and 354 is summed with current on the second input terminal 331. This aspect may compensate for the difference in current between the first input terminal 330 and the second input terminal 331.

For the circuit 356, one current value (e.g., the first converted current signal) as output by the feedback network circuit 380 is summed with a current that is output by the first current transfer system 301 and the other current value (e.g., the second converted current signal) as output by the feedback network circuit 380 is summed with a current that is output by the second current transfer system 302. This aspect may compensate for the difference in current between the first input terminal 330 and the second input terminal 331. The method 800 may execute operations 801, 803, 804, and 805 any number of times for each of the first circuit 350, the second circuit 352, the third circuit 354, and the fourth circuit 356. Additionally or alternatively, the method 800 may execute operations 801, 803, 804, and 805 in any combination thereof.

It is recognized that the feedback network circuit 380 may convert the voltage input signal in current output signals, provide feedback current mode signals to inputs of the first and the second input current transfer systems 301, 302, or provide the feedback current mode signals to inputs of the current difference producing system 303.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A differential amplifier comprising:
a first input terminal to provide a first current signal;
a second input terminal to provide a second current signal;
a first current transfer system to generate a first differential current signal in response to the first current signal;
a second current transfer system to generate a second differential current signal in response to the second current signal;
a current difference producing system to receive the first differential current signal and the second differential current signal and to generate a voltage difference signal that is indicative of a difference between the first current signal and the second current signal; and
a feedback network circuit to:
convert the voltage difference signal into at least two converted current signals; and
provide the at least two converted current signals to one of the current difference producing system or the first and the second current transfer systems to minimize the difference between the first current signal and the second current signal based on the at least two converted current signals, wherein:
the feedback network circuit generates a first converted current signal and a second current converted signal of the at least two converted current signals;
the first converted current signal has the same value as the second converted current signal,
the first converted current signal has an opposite polarity to that of the second converted current signal,
the feedback network circuit applies the first converted current signal to an input of the first current transfer system to sum the first converted current signal to the first current signal; and
the feedback network circuit applies the second converted current signal to an input of the second current transfer system to sum the second converted current signal to the second current signal.

2. The differential amplifier of claim 1, wherein a sum of the first converted current signal and the first current signal and a sum of the second converted current signal of the second current signal minimizes the difference between the first current signal and the second current signal.

3. The differential amplifier of claim 1, wherein:
the feedback network circuit applies the first converted current signal to a first input of the current difference producing system to sum the first converted current signal to the first differential current signal; and
the feedback network circuit applies the second converted current signal to a second input of the current difference producing system to sum the second converted current signal to the second differential current signal.

4. The differential amplifier of claim 3, wherein the sum of the first converted current signal to the first current signal and the sum of the second converted current signal to the second current signal minimizes the difference between the first current signal and the second current signal.

5. The differential amplifier of claim 1, wherein the feedback network circuit includes a current steering system having passive components and a transimpedance stage.

6. The differential amplifier of claim 5, wherein the transimpedance stage is a current-controlled current source that forms a current feedback network with the passive components.

7. The differential amplifier of claim 1, wherein the feedback network circuit includes a current steering system having passive components and a transconductance stage.

8. The differential amplifier of claim 7, wherein the transconductance stage provides the at least two converted current signals to the first and second current transfer systems to minimize the difference between the first current signal and the second current signal.

9. The differential amplifier of claim 7, wherein the transconductance stage provides the at least two converted current signals to the current difference producing system to minimize the difference between the first current signal and the second current signal.

10. A differential amplifier comprising:
a first current transfer system to generate a first differential current signal in response to a first current signal;
a second current transfer system to generate a second differential current signal in response to a second current signal;
a current difference producing system to receive the first differential current signal and the second differential current signal and to generate a voltage difference signal that is indicative of a difference between the first current signal and the second current signal; and
a feedback network circuit to:
   convert the voltage difference signal into at least two converted current signals; and
   provide the at least two converted current signals to one of the current difference producing system or the first and second current transfer systems to minimize the difference between the first current signal and the second current signal based on the at least two converted current signals,
wherein the feedback network circuit includes a current steering system having a first plurality of passive components and a transconductance stage, and
wherein the transconductance stage provides the at least two converted current signals to the current difference producing system to minimize the difference between the first current signal and the second current signal.

11. The differential amplifier of claim 10, wherein the feedback network circuit further includes a second plurality of passive components and a transimpedance stage.

12. The differential amplifier of claim 11, wherein the transimpedance stage is a current-controlled current source that forms a current feedback network with the second plurality of passive components.

13. The differential amplifier of claim 10, wherein the transconductance stage is a voltage controlled current source and a load that forms a current feedback network with the first plurality of passive components.

14. A method for minimizing current between a first current and a second current, the method comprising:
   providing a first current signal and a second current signal;
   generating a first differential current signal via a first current transfer system in response to the first current signal;
   generating a second differential current signal via a second current transfer system in response to the second current signal;
   receiving the first differential current signal and the second differential current signal at a current difference producing system;
   providing a voltage difference signal that is indicative of a difference between first current signal and the second current signal;
   converting the voltage difference signal into at least two converted current signals;
   providing the at least two converted current signals to one of a current difference producing system or the first and the second current transfer systems to minimize the difference between the first current signal and the second current signal based on the at least two converted current signals;
   providing a feedback network circuit that includes a current steering system having passive components and a transconductance stage, and
   providing the at least two converted current signals via the transconductance stage to the current difference producing system to minimize the difference between the first current signal and the second current signal.

15. A differential amplifier comprising:
a first input terminal to provide a first current signal;
a second input terminal to provide a second current signal;
a first current transfer system including a first transistor having a first emitter to generate a first differential current signal in response to the first current signal;
a second current transfer system including a second transistor having a second emitter to generate a second differential current signal in response to the second current signal;
a current difference producing system to receive the first differential current signal and the second differential current signal and to generate a voltage difference signal that is indicative of a difference between the first current signal and the second current signal; and
a feedback network circuit to:
   convert the voltage difference signal into at least two converted current signals; and
   provide the at least two converted current signals to one of the current difference producing system or the first and second current transfer systems to minimize the difference between the first current signal and the second current signal based on the at least two converted current signals,
wherein:
the feedback network circuit generates a first converted current signal and a second current converted signal of the at least two converted current signals,
the first converted current signal has the same value as the second converted current signal,
the first converted current signal has an opposite polarity to that of the second converted current signal,
the feedback network circuit applies the first converted current signal to a first input of the current difference producing system to sum the first converted current signal to the first differential current signal, and
the feedback network circuit applies the second converted current signal to a second input of the current difference producing system to sum the second converted current signal to the second differential current signal.

16. A differential amplifier comprising:
a first input terminal to provide a first current signal;
a second input terminal to provide a second current signal;
a first current transfer system to generate a first differential current signal in response to the first current signal;
a second current transfer system to generate a second differential current signal in response to the second current signal;
a current difference producing system to receive the first differential current signal and the second differential current signal and to generate a voltage difference signal that is indicative of a difference between the first current signal and the second current signal; and
a feedback network circuit to:
   convert the voltage difference signal into at least two converted current signals; and
   provide the at least two converted current signals to one of the current difference producing system or the first and second current transfer systems to minimize the difference between the first current signal and the second current signal based on the at least two converted current signals,
wherein the feedback network circuit includes a current steering system having passive components and a transconductance stage, and
wherein the transconductance stage provides the at least two converted current signals to the current difference producing system to minimize the difference between the first current signal and the second current signal.

* * * * *